United States Patent [19]

Woo et al.

[11] Patent Number: 4,774,201

[45] Date of Patent: Sep. 27, 1988

[54] TUNGSTEN-SILICIDE REOXIDATION TECHNIQUE USING A CVD OXIDE CAP

[75] Inventors: Been-Jon Woo, Saratoga; Wei-Jen Lo, Cupertino, both of Calif.

[73] Assignee: Intel Corporation, Santa Clara, Calif.

[21] Appl. No.: 142,907

[22] Filed: Jan. 7, 1988

[51] Int. Cl.$^4$ .......................................... H01L 21/316
[52] U.S. Cl. ........................................ 437/41; 437/43; 437/238; 437/239; 437/200; 437/161; 437/193; 148/DIG. 118
[58] Field of Search ..................... 437/40, 41, 42, 43, 437/192, 193, 200, 235, 238, 239, 161; 148/DIG. 147, DIG. 118

[56] References Cited

U.S. PATENT DOCUMENTS

| | | | |
|---|---|---|---|
| 4,128,670 | 12/1978 | Gaensslen | 148/DIG. 147 |
| 4,285,761 | 8/1981 | Fatula, Jr. et al. | 156/628 |
| 4,510,172 | 4/1985 | Ray | 437/238 |
| 4,616,399 | 10/1986 | Ooka | 437/44 |
| 4,728,617 | 3/1988 | Woo et al. | 437/30 |

OTHER PUBLICATIONS

M. Y. Tsai et al., "One-Micron Polycide (WSi on Poly-Si) MOSFET Technology"; J. Electrochem. Soc.: Solid-State Science and Technology; Oct. 1981; pp. 2207-2214.

S. Zirinsky et al., "Oxidation Mechanisms in WSi$_2$ Thin Films"; Appl. Phys. Lett. 33(1); Jul. 1, 1978; pp. 76-78.

F. Mohammadi et al., "Kinetics of the Thermal Oxidation of WSi$_2$"; Appl. Phys. Lett., vol. 35, No. 7; Oct. 1, 1979; pp. 530-531.

M. Ayukawa et al., "CVD WSix Oxidation Characteristics with Ion Implanation Method"; V-MIC Conf.; Jun. 15-16, 1978; pp. 314-320.

Primary Examiner—Brian E. Hearn
Assistant Examiner—T. N. Quach
Attorney, Agent, or Firm—Blakely, Sokoloff, Taylor & Zafman

[57] ABSTRACT

A tungsten silicide reoxidation technique for forming a reoxidation layer in a CMOS MOSFET device. After forming an insulated gate member, which has a tungsten silicide layer overlying a polysilicon layer, a CVD oxide layer is deposited on the exposed and crystallized tungsten silicide layer to function as a cap prior to the formation of the reoxidation layer. The CVD oxide layer operates to slow the passage of oxygen atoms to combine with the tungsten atoms of the silicide layer but allows free migration of silicon atoms from the polysilicon layer to the tungsten silicide surface and combine with the oxygen atoms in forming a substantially planarized and uncontaminated reoxidation layer without the requirement of a substantially pure nitrogen ambient.

5 Claims, 4 Drawing Sheets

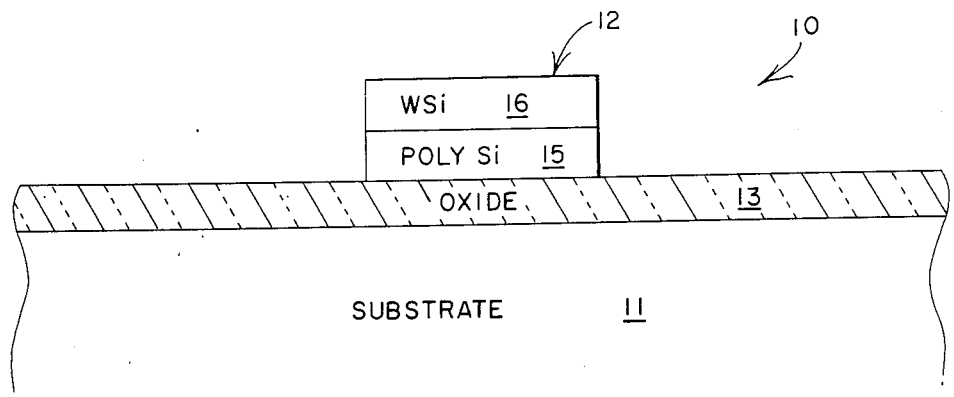
FIG_1
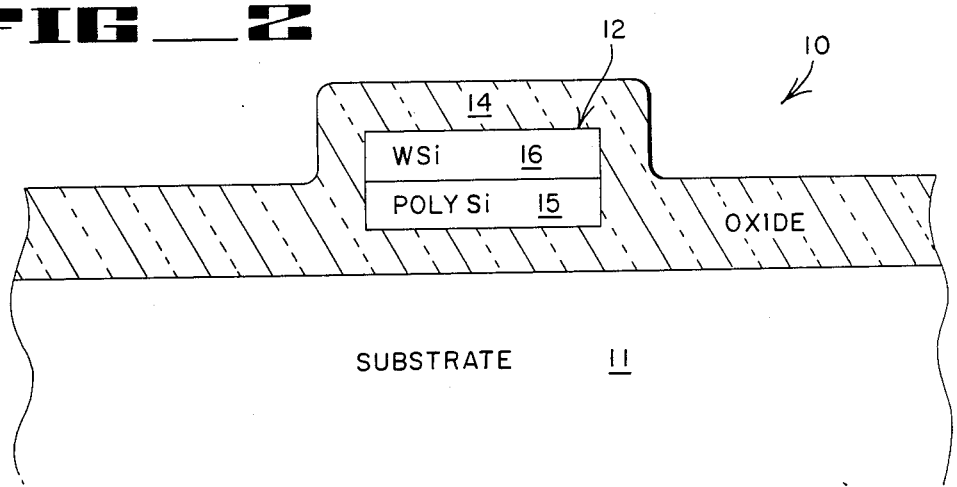
FIG_2
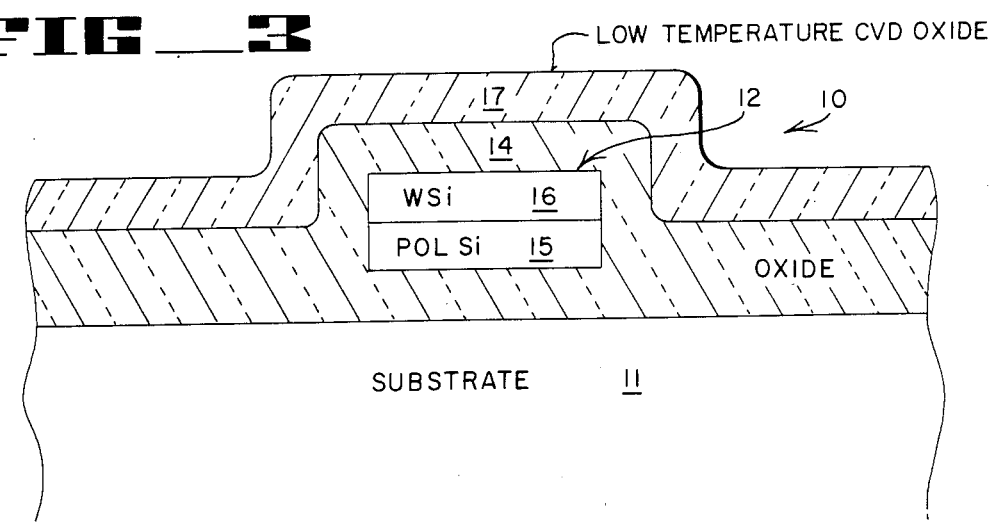
FIG_3

FIG_4A
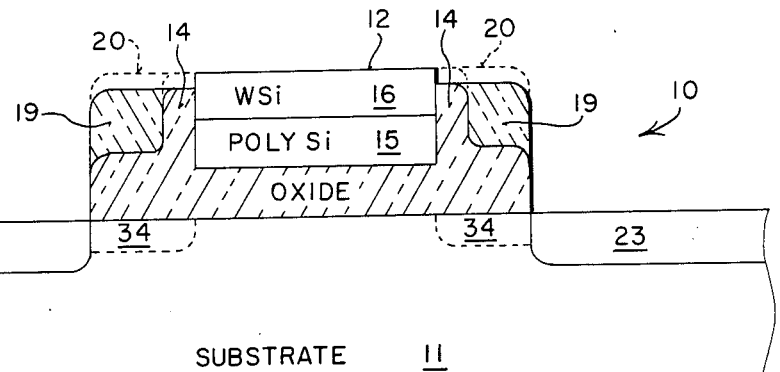
FIG_4B
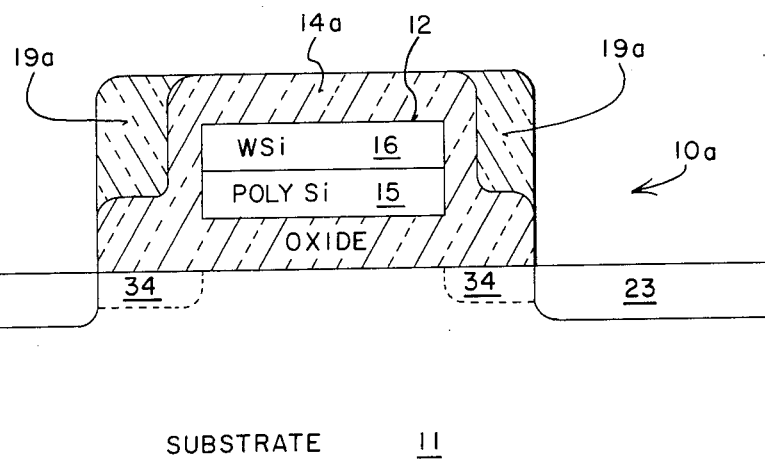

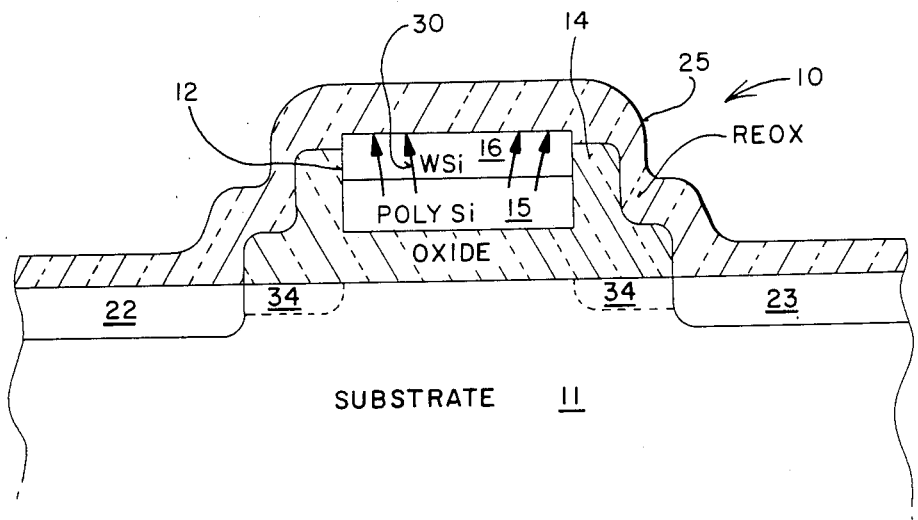
FIG_5
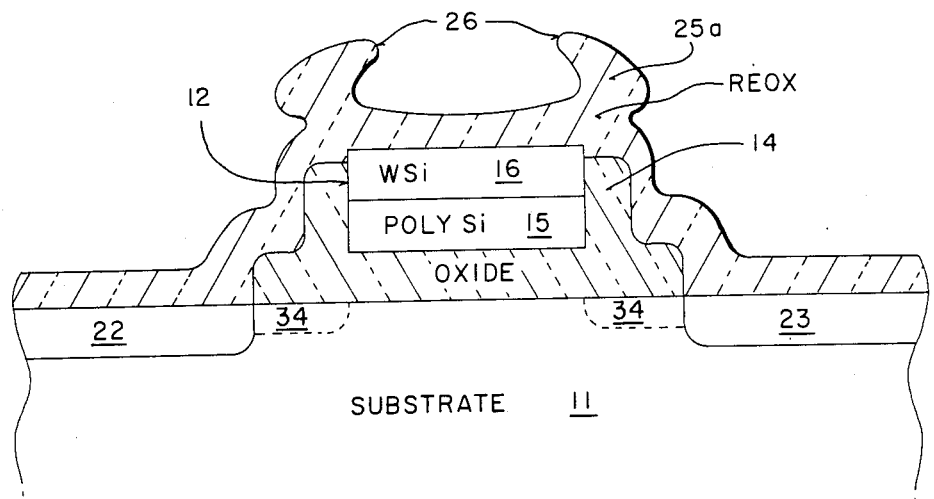
FIG_6

FIG_7
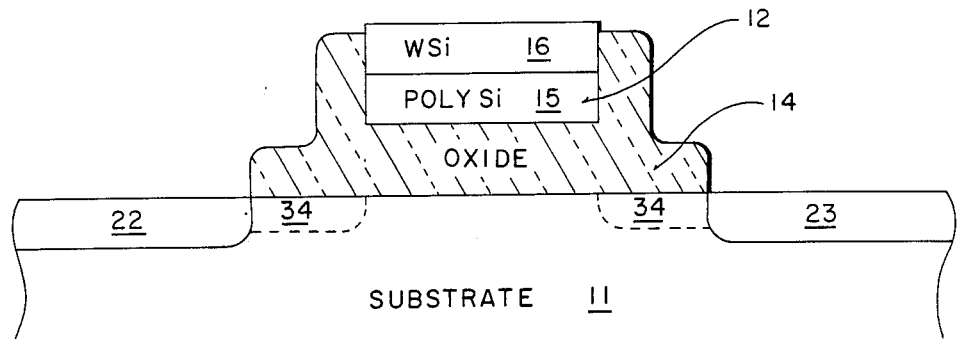
FIG_8
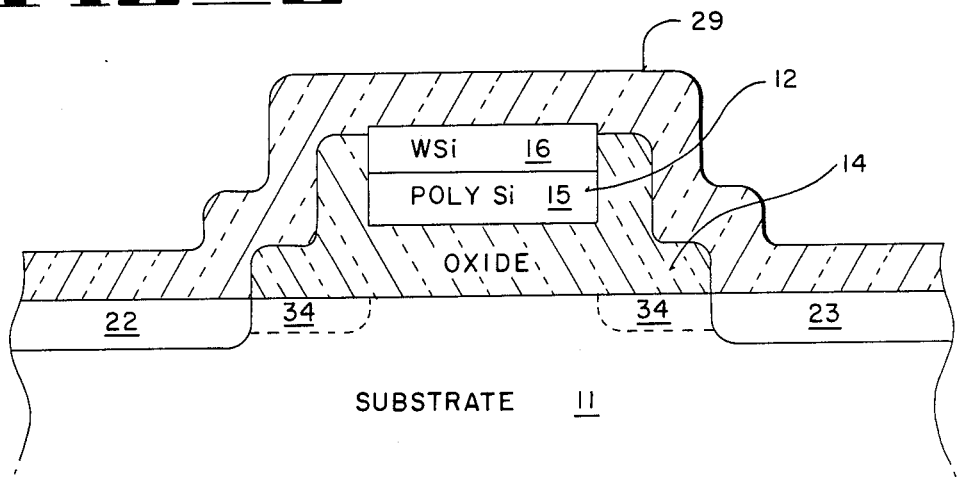
FIG_9
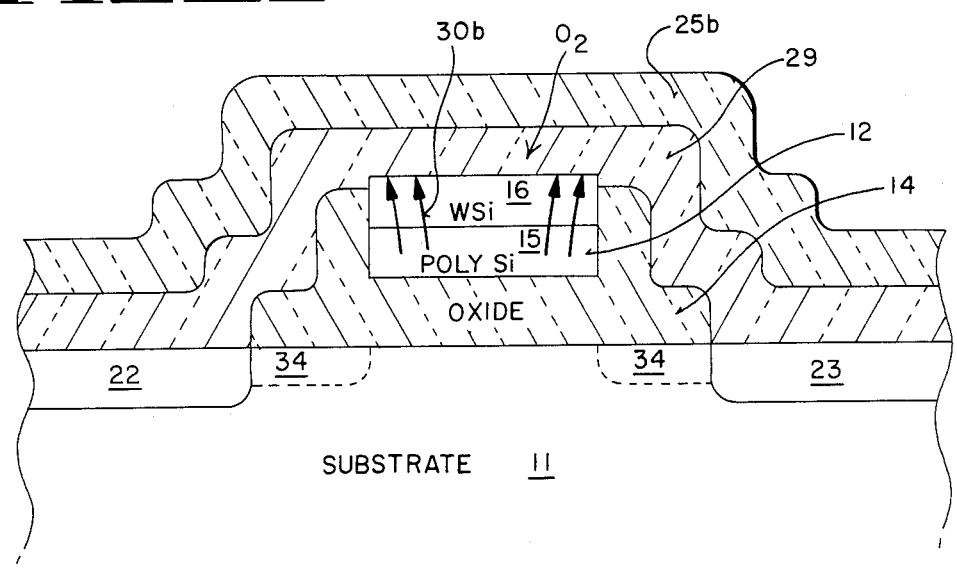

TUNGSTEN-SILICIDE REOXIDATION TECHNIQUE USING A CVD OXIDE CAP

BACKGROUND OF THE INVENTION

1. Field of the Invention

This invention relates to the field of metal-oxide-semiconductor (MOS) fabrication, and more particularly to a process for forming a reoxidation layer over a gate element during the fabrication of complementary metal-oxide-semiconductor (CMOS) devices.

2. Prior Art

In the manufacture of metal-oxide-semiconductor field effect transistors (MOSFETs), a technique of using tungsten to form a silicide is well-known in the prior art. These metallic silicides, and more specifically tungsten silicide (WSi), are deposited above a polysilicon layer to form a gate member. A silicide layer is used in the gate member to provide a better contact between the gate member and interconnection lines which interconnect the gate member to various other elements of the device. Typically, these interconnection lines are fabricated from aluminum.

In the manufacture of these MOSFET devices, a polysilicon layer is formed over a dielectric layer, such as an oxide, and the silicide layer is deposited over the polysilicon layer to form a gate member. Then, source and drain regions are formed. In one process using a lightly doped drain technique, a first oxide layer is formed over the gate member, a CVD spacer oxide is deposited and various photolithographic and etching techniques are used to shape the gate region for forming lightly doped drain and source regions. The drain and source regions are doped by known techniques such as by using implantation techniques. Then the oxide spacer layer is removed exposing the silicide portion of the gate member. One such lightly doped technique is described in copending application Ser. No. 926,733; filed Nov. 4, 1986, now U.S. Pat. No. 4,728,617 and titled "Method of fabricating a MOSFET with graded source and drain regions". Then prior to the deposition of subsequent upper layers, such as the interdielectric layer, a reoxidation technique is used to form a second oxide (reoxidation) layer over the gate member. A reoxidation layer is used in order to ensure good gate edge quality to obtain higher gate edge oxide breakdown voltage, as well as annealing the source and drain dopants. A popular technique is to grow a silicon dioxide (SiO$_2$) reoxidation layer over the silicide gate member in which silicon atoms are supplied by the silicide layer because it is silicon rich as deposited and combine with the oxygen atoms to grow a SiO$_2$ layer over the gate member.

Various prior art techniques describe methods of providing the technique of forming the first oxidation:

(1) "One-Micron Polycide (WSi$_2$ on Poly-Si) MOSFET Technology"; M. Y. Tsai et al; Journal of Electrochem. Soc.; Solid State Science and Technology; October 1981; pp. 2207-2214.

(2) "Oxidation mechanisms in WSi$_2$ thin films"; S. Zirinsky et al; Appl. Phys. Lett., 33(1); American Institute of Physics; July 1, 1978; pp. 76-78.

(3) "Kinetics of the thermal oxidation of WSi$_2$"; F. Mohammadi et al; Appl. Phys. Lett.; Vol. 35, No. 7; Oct. 1, 1979; pp. 529-531. However, at the reoxidation step, the silicide film will exhibit a rough textured surface and further causes a non-uniform concentration of tungsten atoms which is supplied by the silicide when Si is not present in an oxidized ambient. As the reoxidation layer is grown over the oxidized silicide, a rough textured oxide deposit is formed above the silicide region of the gate member instead of a smooth planarized surface. In many instances curved "horns" form over the gate member. The non-planarized surface makes it difficult, and in some instances impossible, to form subsequent layers on the silicide portion of the gate member.

To alleviate this problem, one disclosed technique implants phosphorus into the silicide layer to pretreat the silicide prior to the reoxidation occurring. One such technique is disclosed in (4) "CVD WSix Oxidation Characteristics with Ion Implantation Method"; M. Ayukawa et al; V-MIC Conf., IEEE; June 15-16, 1987; pp. 314-320. However, the phosphorus implantation technique disclosed in Reference 4 is not compatible for use in the fabrication of CMOS devices because of the presence of p-channel transistors in a CMOS device.

A second technique is disclosed in copending application Ser. No. 142,906; filed Jan. 7, 1988 and titled "Tungsten-Silicide reoxidation technique using substantially pure nitrogen"; which is assigned to the assignee of the present application. This copending application describes a method of subjecting the MOSFET device to a substantially pure nitrogen ambient at a temperature of approximately 700° to 900°. The described annealing step in substantially pure nitrogen ambient permits the tungsten silicide to be annealed and Si to be pulled from the base polysilicon layer; and also permits the formation of a substantially planarized and uncontaminated reoxidation layer over the gate member. However, to practice the invention as described in the copending application Ser. No. 142,906, a nitrogen ambient having a purity of at least 99.5% is required. In a tightly controlled environment such nitrogen purity can be obtained and maintained during the requisite steps of reoxidation. However, in many instances a purity concentration of at least 99.5% nitrogen is difficult to achieve and is more difficult to maintain. Where the purity of nitrogen cannot be maintained, curved "horns" form over the gate member and present problems as described earlier.

Therefore, what is required is a reoxidation technique for forming a chemical vapor deposition (CVD) deposited oxide cap layer over a silicide region of a gate member prior to the reoxidation step without the requirement of a substantially pure nitrogen ambient. Further, this technique must be capable of fabricating a CMOS device which is comprised of both n-channel and p-channel transistors.

SUMMARY OF THE PRESENT INVENTION

A novel technique for forming a reoxidation layer on a tungsten silicide gate without the use of substantially pure nitrogen is described. An insulated gate member having a polysilicon layer on a WSi layer is formed above a silicon substrate having a silicon dioxide insulating layer. A first oxidation layer is formed about the gate. A low temperature CVD oxide layer is formed above the first oxidation layer and both are etched so that only a portion of the CVD oxide and the first oxidation layers remain to form spacers above the gate member. Next, spaced apart source and drain regions are formed. The spacers are then removed. Prior to forming a reoxidation layer, a CVD deposited low temperature oxide layer of approximately 500 to 1000 angstroms is deposited as a cap over the WSi layer. Then the device is placed in a furnace of approximately 920° C. so that silicon atoms from the polysilicon layer are pulled free to combine with the oxygen atoms which are introduce into the furnace. The CVD oxide layer functions to slow the passage of oxygen atoms through the cap layer to react with the tungsten atoms of the WSi layer before Si can be pulled from the base polysilicon layer. These free silicon atoms combine with the oxygen atoms to form the reoxidation layer.

BRIEF DESCRIPTION OF THE DRAWINGS

FIG. 1 illustrates the formation of an insulated gate member on a substrate when the gate member is comprised of a polysilicon layer underlying a tungsten silicide layer.

FIG. 2 illustrates formation of a first oxide layer about the gate member.

FIG. 3 illustrates the deposition of a low temperature CVD oxide layer over the first oxide layer.

FIG. 4a illustrates the etching of the oxide layer to form spacer elements about the gate member and doped drain and source regions.

FIG. 4b illustrates an alternative embodiment in the formation of the spacers and the doped drain and source regions.

FIG. 5 illustrates the formation of a typical reoxidation layer when practicing the process of the present invention.

FIG. 6 illustrates an undesirable effect which results during the reoxidation step, wherein this undesirable effect is cured by the practice of the present invention.

FIG. 7 illustrates the device of FIG. 4a after the removal of the spacer elements.

FIG. 8 illustrates the deposition of the CVD oxide cap over the silicide layer.

FIG. 9 illustrates the formation of the reoxidation layer over the CVD oxide cap.

DETAILED DESCRIPTION OF THE PRESENT INVENTION

The present invention describes a technique for forming a reoxidation layer in a CMOS MOSFET device. In the following description, numerous specific details are set forth such as specific thickness, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

Referring to FIG. 1, a semiconductor device 10 is shown having a gate 12 formed over a substrate 11. Substrate 11 is comprised of silicon and is separated from the gate 12 by a dielectric layer 13 which is typically comprised of an oxide layer such as $SiO_2$. The gate 12 is comprised of a lower layer 15 comprised of polysilicon and an upper layer 16 comprised of WSi. The formation of oxide layer 13, polysilicon layer 15 and WSi layer 16 to form an insulated gate 12 is well-known in the prior art. The earlier stated references 1, 2 and 3 describe formation of an oxide layer on a silicide layer 16 over a polysilicon layer 15. As used in a preferred embodiment, a silicide layer 16 initially is amorphous and has a composition of $WSi_{2.7}$ which is silicon rich.

Referring to FIG. 2, a first oxidation step provides for the first oxidation of the deposited WSi layer 16. The purpose of oxide layer 14 of the preferred embodiment is to provide an oxide layer for the unique graded source and drain CMOS MOSFET device which is described in the afore-mentioned copending patent application Ser. No. 926,733. Further, this step has been described in references 1–3, which use excessive amounts of silicon atoms supplied by as-deposited $WSi_{2.7}$ to react with oxygen atoms in oxidation ambient to form layer 14. This oxidation step typically will increase the thickness of the original oxide layer 13.

Then a chemical vapor deposition (CVD) deposited oxide layer 17 is formed along the side walls and upper surface of gate 12 and oxide layer 14, as is shown in FIG. 3. The preferred embodiment uses a low temperature thermal oxide (LTO) technique to deposit oxide layer 17. Next, oxide layer 17 is etched back using an anisotropic etching technique which is well-known in the prior art, to form spacers 19 as shown in FIG. 4a.

In FIG. 4a because of the anisotropic etch, side members or spacers 19 are formed along the side walls of gate 12 adjacent to oxide layer 14. These spacers 19 can be at the same height as gate 12 (as shown by dotted lines 20 in FIG. 4a), or in some instances spacers 19a may be higher than gate 12 as is shown in FIG. 4b. This is due to a thin layer of oxide layer 14a which may remain on the upper surface of gate 12. It is appreciated that the preferred embodiment uses oxide layer 17 to form spacers 19 during the first oxidation sequence. However, the reoxidation technique described below can be used without layer 17 or spacers without departing from the spirit and scope of the invention.

Further, various technique are available to form differently shaped spacers 19 to improve the implantation of adjacent drain and source regions which will be formed for device 10. A technique to form the device 10 (and 10a) shown in FIG. 4a and 4b, along with the implantation of source and drain regions including tip implants 34, is disclosed in the afore-mentioned copending application Ser. No. 926,733. The formation of a two layered silicide gate 12 is well documented in references 1–3. During the first oxidation step, the amorphous silicide $WSi_{2.7}$ is crystalized to form $WSi_{2.2}$. Then CVD oxide spacers 19 are formed. Then, adjacent source and drain regions 22–23 are formed, such as by implantation as is described in the copending application Ser. No. 926,733. The oxide spacers 19 are typically removed before the reoxidation step and also before annealing the source and drain regions 22–23. As to the structure of FIG. 4b, the etching step for removing the spacers 19a will also typically etch back oxide layer 14a such that the WSi layer 16 is exposed at the upper surface. In essence, FIG. 4b will eventually appear to resemble that of FIG. 4a before device 10 is subjected to reoxidation.

Referring to FIG. 5, it shows an ideal situation when layer 25, which comprises the reoxidation layer, is formed above oxide layer 14 and gate 12 of FIG. 4a. The formation of oxide layer 25 can only be achieved if silicon atoms are supplied from the polysilicon layer 15 prior to the reoxidation step commencing. The silicon atoms will react with the oxygen atoms introduced into the oxidation chamber and arrows 30 illustrate the transfer of silicon atoms from polysilicon layer 15. The silicon atoms need to be supplied from polysilicon layer 15 instead of WSi layer 16 because excess silicon atoms are not available at the exposed portion of crystallized $WSi_{2.2}$ layer 16. The transfer of silicon atoms from polysilicon layer 15 is accomplished by the application of heat ambient.

In practice, during the formation of reoxidation layer 25 "horns" 26, as shown in FIG. 6, form above the gate region making oxide layer 25a unacceptable for formation of subsequent layers. Concentration of tungsten atoms drawn from the silicide layer 16 causes roughened surfaces on the reoxidation layer and these tungsten atoms combine with oxygen atoms to form "horns" 26.

Copending application Ser. No. 142,906 describes a method of using a substantially pure nitrogen ambient to provide a smooth reoxidation layer 25 for WSi 16. However, when tight control of pure $N_2$ is difficult to achieve in certain manufacturing facilities or environments, "horns" 26 of FIG. 6 will be encountered during the reoxidation process.

In order to provide a substantially planarized and uncontaminated reoxidation layer 25 in the absence of a substantially pure nitrogen environment, a technique as is shown in FIGS. 7-9 is required. Referring to FIG. 7, the device of FIG. 4a, after having its first oxidation layer, spacers, source and drain regions formed and subsequently having the spacers removed is shown. Then, as is shown in FIG. 8, a low temperature oxide layer 29 is deposited over gate member 12, oxide layer 14, source and drain regions 22-23. The preferred embodiment deposits a low temperature oxide layer by a chemical vapor deposition (CVD) technique to an approximate thickness of 500 to 1000 angstroms. This CVD oxide layer 29 covers the silicide layer 16 of gate member 12. It is to be appreciated that most known dielectric material, such as a nitride material, can be used instead of a low temperature CVD oxide without departing from the spirit and scope of the invention.

In FIG. 9, the device of FIG. 8 is then placed in a furnace or a chamber for the purpose of forming a reoxidation layer 25b. At a temperature of approximately 920° C., silicon atoms are pulled from the polysilicon layer 15 as is shown by arrow 30b. The silicon atoms are activated free from the polysilicon layer 15 due to the presence of heat ambient and when oxygen is introduced into the furnace, the silicon atoms will combine with the oxygen atoms to form the reoxidation layer 25b.

The thickness of CVD oxide layer 29 is crucial in the respect that a predetermined minimum thickness must be maintained to slow oxygen atoms from penetrating oxide cap 29 and attacking the silicide layer 16 prior to a certain adequate amount of Si supplied by being pulled from the base polysilicon layer 15 for the formation of reoxidation layer 25b. Therefore, oxide layer 29 must have a predetermined minimum thickness to slow the diffusion of oxygen atoms through this layer 29 before it reacts with the tungsten atoms of the silicide layer 16. The minimum thickness of oxide layer 29 is to slow the penetration of the oxygen atoms such that these oxygen atoms will reach the WSi 16 at a predetermined rate. By the time the layer 29 is penetrated significantly, Si atoms will have reached the WSi 16 surface to combine with the oxygen atoms. Further, oxide layer 29 must also maintain a maximum limit to its thickness such that later back end step coverage can be achieved, such as intermetal dielectric flow.

The oxide layer 29 of the present invention has a minimum thickness of 500 angstroms. The preferred embodiment has an oxide thickness of approximately 500 to 1000 angstroms when the device of FIG. 8 is heated in a furnace at a temperature of approximately 920° C. It is to be appreciated that the maximum thickness will vary in proportion to the temperature of the furnace. By utilizing an underlying CVD oxide layer 29 to provide a cap over the WSi 16 of gate member 12, a substantially planarized and uncontaminated reoxidation layer 25b is formed without the requirement of a substantially pure $N_2$.

In addition, as is described in the copending application Ser. No. 926,733, the source 22 and drain 23 can be made to extend under oxide 14 prior to the formation of oxide layer 29 and/or reoxidation layer 25b.

Thus a novel technique for WSi reoxidation in the absense of substantially pure nitrogen is described.

We claim:

1. A method of fabricating metal-oxide-semiconductor integrated circuit where a reoxidation layer is formed on an insulated gate member which overlies a substrate and in which said insulated gate member is comprised of a silicide layer overlying a polysilicon layer, comprising the steps of:
   (a) forming an oxidation insulating layer over opposite sides and upper surface of said gate member;
   (b) forming spacers abut said gate member;
   (c) etching said oxidation insulating layer to expose upper surface of said silicide layer of said gate member;
   (d) forming source and drain regions in said substrate;
   (e) forming a dielectric layer over said exposed upper surface of said silicide layer of said gate member, said dielectric layer having a thickness of at least 500 angstrom;
   (f) placing said device of step (e) in a furnace having a temperature of approximately 920° C.;
   (g) forming said reoxidation layer above said gate member by introducing oxygen into said furnace wherein oxygen atoms react with silicon atoms which are pulled free from said polysilicon layer to form said reoxidation layer, said reoxidation layer being substantially formed prior to said oxygen atoms penetrating said dielectric layer and said formed reoxidation layer to react with tungsten atoms of said silicide layer such that said reoxidation layer is formed having substantially planarized and uncontaminated surface.

2. The method defined in claim 1 wherein said dieletric layer is comprised of a chemical vapor deposited low temperature oxide.

3. The method of claim 1 wherein said dielectric layer has a thickness of between 500 and 1000 angstroms.

4. The method of claim 2 wherein said dielectric layer has a thickness of between 500 and 1000 angstroms.

5. The method of claim 4 wherein said spacers are formed from a low temperature oxide.

* * * * *